United States Patent
Holmes et al.

(10) Patent No.: US 6,714,008 B1
(45) Date of Patent: Mar. 30, 2004

(54) GRADIOMETRIC MEASUREMENT METHODOLOGY FOR DETERMINING MAGNETIC FIELDS OF LARGE OBJECTS

(75) Inventors: John J. Holmes, Columbia, MD (US); John F. Scarzello, Columbia, MD (US); Bruce R. Hood, Arnold, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 53 days.

(21) Appl. No.: 10/206,761

(22) Filed: Jul. 29, 2002

(51) Int. Cl.$^7$ .............................................. G01R 33/00

(52) U.S. Cl. ........................ 324/261; 324/260; 324/247

(58) Field of Search ................................ 324/261, 244, 324/247, 258, 260, 253; 342/22, 27; 340/850; 343/719; 361/139, 143

(56) References Cited

U.S. PATENT DOCUMENTS

| | | |
|---|---|---|
| 4,302,746 A | 11/1981 | Scarzello et al. |
| 4,323,900 A | 4/1982 | Krall et al. |
| 5,038,103 A | 8/1991 | Scarzello et al. |
| 5,189,590 A | 2/1993 | Schneider |
| 5,440,232 A | 8/1995 | Scarzello et al. |
| 5,463,523 A | 10/1995 | Holmes et al. |
| 5,483,410 A | 1/1996 | Holmes et al. |
| 5,598,152 A | 1/1997 | Scarzello et al. |
| 5,886,661 A | 3/1999 | Harrison et al. |
| 6,208,268 B1 | 3/2001 | Scarzello et al. |
| 6,278,272 B1 | 8/2001 | Scarzello et al. |
| 6,344,743 B1 | 2/2002 | Holmes et al. |
| 6,456,069 B1 | 9/2002 | Scarzello et al. |

OTHER PUBLICATIONS

John J. Holmes, "Theoretical Development of Laboratory Techniques for Magnetic Measurement of Large Objects," *IEEE Transactions on Magnetics*, vol. 37, No. 5, Sep. 2001, pp 3790–3797.

Thomas N. Roy, "Spacecraft Magnetic Field Modeling," *IEEE Transactions on Magnetics*, vol. mag–13, No. 1, Jan. 1977, pp 914–919.

Robert A. Wingo, John J. Holmes and Milton H. Lackey, "Test of Closed–Loop Degaussing Algorithm on a Minesweeper Engine," 1992 Proceedings of the American Society of Naval Engineers, *Naval Engineers Journal*, May 1992, pp 219–227.

(List continued on next page.)

*Primary Examiner*—Jay Patidar
(74) *Attorney, Agent, or Firm*—Howard Kaiser (57) ABSTRACT

Gradiometers are encompassingly disposed, relative to an object of interest, in a configuration generally describing a closed prolate spheroidal shape, and the measurements taken by the gradiometers are mathematically processed. The gradiometric measurements are defined as directional derivatives which exist in equations involving directional derivatives and prolate spheroidal multipole moments of said entity. The prolate spheroidal multipole moments are thereby calculated, and these prolate spheroidal multipole moment values are extrapolated to ascertain the magnetic fields (equivalently expressed, the magnetic signatures) associated with the object and inwardly delimited by the prolate spheroid. The practitioner can optimize such distribution numerically, orientationally and/or positionally by using the equations involving directional derivatives and prolate spheroidal multipole moments. Extraneous magnetic field effects (e.g., applied fields, earth fields) are inherently excluded, thus obviating the object's removal from an electromagnetic test facility.

20 Claims, 3 Drawing Sheets

(1 of 3 Drawing Sheet(s) Filed in Color)

OTHER PUBLICATIONS

Martin Norgren and Sailing He, "Exact and Explicit Solution to a Class of Degaussing Problems," *IEEE Transactions on Magnetics*, vol. 36, No. 1, Jan. 2000, pp 308–312.

Otto N. Strand and EdR. Westwater, "Statistical Estimation of the Numerical Solution of a Fredholm Integral Equation of the First Kind," *Journal of the Association for Computing Machinary*, vol. 15, No. 1, Jan. 1988, pp 100–114.

Alexander A. Timonov, "Regularising Algorithms for Inverse Modelling Problems: Anomaly Detection and Source Localization," in *Proc. MARELEC 1999*, pp 53–62, Jul. 1999.

"Gradiometer Type GS2," manufactured by the ULTRA Electronics Magnetics Division, Fallow Park, Rugely Road, Hednesford, Cannock, Staffordshire, England WS12 5QZ, 2–page excerpt from brochure.

"GS2" (Gradiometer Type GS2), manufactured by the ULTRA Electronics Magnetics Division, Fallow Park, Rugely Road, Hednesford, Cannock, Staffordshire, England WS12 5QZ, Ultra Electronics website, 1–page printout from http://www.ultra.demon.co.uk/gs2.htm.

"PUGRAD–12: Precision Single Axis Fluxgate Gardiometer," manufactured by Billingsley Magnetics, 26000 Brighton Dam Road, Brookesville, Maryland 20833, Billingsley Magnetics website, 2–page printout from http://www.magnetometer.com/pugrad12.

"Three Axis Fluxgate Magnetic Gradiometers," manufactured by Bartington Instruments, 10 Thorney Leys Business Park, Witney, Oxford, England Ox8 7Ge, 5–page printout from http://www.bartington.com/fluxgrad.htm.

Joel C. W. Rogers, "Determination of the Magnetic Field beneath a Plane by Measurement of Oblique Field Components of the Plane," NSWC/WOL/TR 76–28, Naval Surface Weapons Center, White Oak, Silver Spring, Maryland, Mar. 25, 1976 (23 pages).

M. Lackey, "Computer Programs for the Analysis of Spacecraft Magnetism," NSWC/WOL TR 73–191, Naval Surface Warfare Center, Silver Spring, MD, Sep. 1973 (171 pages).

- Dirichlet: $\Psi_m$
- Neumann: $\bar{H} \cdot \hat{n}$
- Cauchy: $\Psi_m + \bar{H} \cdot \hat{n}$
- Tangential: $\hat{n} \times \bar{H}$
- Scalar Potential Directional Derivative: $(\hat{a} \cdot \nabla)\Psi_m$

GRADIOMETRIC MEASUREMENT METHODOLOGY FOR DETERMINING MAGNETIC FIELDS OF LARGE OBJECTS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to methods and apparatuses for determining a magnetic field, a magnetic field vector or a value related thereto, more particularly for determining a static magnetic field signature associated with an object whereby the applied uniform magnetic field (such as associated with a test facility) and/or the earth's background magnetic field are accounted for in such determination.

Laboratory measurement of the static magnetic fields surrounding large objects can be a difficult process. These experiments are typically conducted within the uniform volume of a large magnetic calibration facility whose coil system can apply fields in three orthogonal directions. In the past, such laboratory tests have included spacecraft, large-scale magnetic models of naval vessels, and full-scale ship equipment such as engines, electric motors, and generators. See the following papers, each of which is incorporated herein by reference: T. N. Roy, "Spacecraft magnetic field modeling," IEEE Trans. Magn., vol. 13, pp 914–919, January 1977; A. V. Kildishev, S. A. Volokhov and J. D. Saltykov, "Measurement of the spacecraft main magnetic parameters," in Proc. 1997 IEEE Autotestcon Systems Readiness Technology Conf., pp 669–675, 1997; R. A. Wingo, J. J. Holmes and M. Lackey, "Test of closed-loop degaussing algorithm on a minesweeper engine," in Proc. 1992 Amer. Soc. Naval Eng., May 1992. In naval applications, the field pattern around and under a ship is called its signature.

The purpose of laboratory experiments is usually to measure an object's field at discrete locations around it, and then to mathematically predict the flux distribution or signature in all space. See F. M. Duthoit, L. Krahenbuhl and A. Nicolas, "The boundary integral equation method for the extrapolation of field measurement," IEEE Trans. Magn., vol. 21, pp 2439–2442, 1985, incorporated herein by reference.

In addition, onboard magnetic field compensation systems called "degaussing" systems are adjusted (calibrated) to minimize the amplitude of the surrounding field. See the following papers, each of which is incorporated herein by reference: K. R. Davy, "Degaussing with BEM and MFS," IEEE Trans. Magn., vol. 30, pp 3451–3454, September 1994; X. Xu and L. Zeng, "Degaussing of cylinders magnetized in Earth's magnetic field—a 2-D model of degaussing of submarine," J. Electromag. Waves Appl., vol. 12, pp1039–1051, 1998; F. Le Dorze, J. P. Bongiraud, J. L. Coulomb, P. Labie and X. Brunotte, "Modeling of degaussing coil effects in ships by the method of reduced scalar potential jump," IEEE Trans. Magn., vol. 34, pp 2477–2480, September 1998; M. Norgren and S. He, "Exact and explicit solution to a class of degaussing problems," IEEE Trans. Magn., vol. 36, pp 308–312, January 2000.

Minimization of a naval vessel's static magnetic field signature is important in reducing its vulnerability to magnetically actuated mines. Also, spacecraft signature reduction is necessary to mitigate attitude control problems, and interference to onboard magnetic instruments and low-energy electron experiments. See aforementioned paper T. N. Roy, "Spacecraft magnetic field modeling," IEEE Trans. Magn., vol. 13, pp 914–919, January 1977.

Large, triaxial, calibration coil facilities presently exist at several U.S. Naval facilities, including the Naval Surface Warfare Center detachment at Panama City, Fla. In addition, a new coil facility is under construction at the Center's Carderock Division, West Bethesda, Md. that will accommodate test items up to 44 tons in weight. The new facility's coil system will generate a uniform magnetic field within a cube 3 meters on a side, with a peak-to-peak spatial variation less than 0.05% of the field along the primary axis. An inducing field can be generated over the uniform volume with a dynamic range of ±50,000 nT, and can be held stable to within ±1 nT, according to D. Whelan of the Naval Surface Warfare Center, West Bethesda, Md. as stated in a private communication (e-mail) to joint inventor John J. Holmes on Jan. 18, 2000. However, laboratory testing of large magnetic objects can present special problems.

An important requirement for a magnetic testing facility is the ability to remove the applied uniform field (facility plus earth's field) from the measurement of an item's signature. Typically, the applied field is eliminated by physically removing the test object from the facility, then recording and storing the sensor readings while energizing each calibration coil, one at a time, with a known current. This "background" data can be scaled; based on real-time measured coil currents or other facility control sensors, and subtracted from all subsequent measurements of the test object. However, removing a test item from inside a coil system is not always viable, especially if the object is physically large, heavy, or has an irregular shape. In some cases, sensors and sections of the coils themselves must be moved to accommodate removal of the test item from the facility. Exact realignment of the sensors and coils is always difficult and time consuming, reducing accuracy and repeatability of the experiments.

A magnetic gradiometer measures the difference between two magnetometers separated by a short distance and mounted on a rigid and thermally stable bar that is usually made of titanium. Special care is taken in the design and construction of a gradiometer to insure that the gain and orientation of its two magnetometers do not change over time with environmental conditions. A commercial product which exemplifies this is Gradiometer Type GS2, manufactured by the ULTRA Electronics Magnetics Division, Fallow Park, Rugely Road, Hednesford, Cannock, Staffordshire, England WS12 5QZ.

SUMMARY OF THE INVENTION

In view of the foregoing, it is an object of the present invention to provide method and apparatus for measuring the magnetic signature of an entity so as to remove the influence of any external field (e.g., an applied magnetic field and/or the earth's magnetic field) from such measurement.

It is a further object of the present invention to provide such method and apparatus for measuring the magnetic signature of an entity which is large or cumbersome or otherwise does not readily admit of portability or transportability relative to a magnetic test facility.

In accordance with many embodiments of the present invention, a method for determining at least one magnetic field signature of an entity comprises the steps of performing gradiometric measurements and processing the gradiometric measurements. The performing of the gradiometric measurements includes using plural gradiometers which are arranged so as to generally describe a closed three-dimensional geometric shape which surrounds the entity. The processing of the gradiometric measurements includes determining the multipole moments of the entity based on the gradiometric measurements, wherein the multipole moments correspond to the closed three-dimensional geometric shape. According to typical inventive embodiments, the closed three-dimensional geometric shape is a prolate spheroid which surrounds the entity, and the multipole moments are the prolate spheroidal multipole moments of the entity (i.e., the multipole moments pertaining to the same prolate spheroidal shape which is geometrically conceived to surround the entity as described by the arrangement of the gradiometers).

Further provided according to the present invention is a computer program product. The present invention's computer program product comprises a computer useable medium having computer program logic recorded thereon for enabling a computer to determine at least one magnetic field signature of an entity. The computer program logic comprises means for enabling the computer to determine the prolate spheroidal multipole moments of the entity. The prolate spheroidal multipole moments (i.e., the multipole moments pertaining to the same prolate spheroidal shape which is geometrically conceived to surround the entity as described by the arrangement of the gradiometers) are based on gradiometric measurements performed using plural gradiometers which are arranged so as to generally describe a prolate spheroidal shape which surrounds the entity.

The present invention also provides apparatus for determining at least one magnetic field signature of an entity. The inventive apparatus comprises a plurality of gradiometers and a computer with which the gradiometers are electrically connected. The gradiometers are for performing gradiometric measurements whereby the gradiometers are arranged so as to generally describe a prolate spheroidal shape which surrounds the entity. The computer is for establishing relationships including the following: relationships between the gradiometric measurements and directional derivatives; relationships between the directional derivatives and the prolate spheroidal multipole moments (i.e., the multipole moments pertaining to the same prolate spheroidal shape which is geometrically conceived to surround the entity as described by the arrangement of the gradiometers); and, relationships between the prolate spheroidal multipole moments and the magnetic field(s) of the entity which exist(s) interior of the prolate spheroidal shape. According to some inventive embodiments, the computer is also used for optimizing the arranging of the gradiometers with respect to at least one parameter selected from the group consisting of the number of the gradiometers, the positions of the gradiometers, and the orientations of the gradiometers.

The term "magnetic field" has been defined as a vector function field which is described by a magnetic induction. The term "magnetic field" has also been defined as a field of magnetic force existing around a current-carrying conductor or magnetic body. The terms "magnetic signature" and "magnetic field signature" have been used in naval and other scientific and engineering contexts to mean a magnetic field pattern or configuration associated with an object. Technical parlance has seen the interchangeable use of the terms "magnetic field," "magnetic signature" and "magnetic field signature" so as to denote any of a variety of manifestations of magnetic field. As used in the instant disclosure, the terms "magnetic field," "magnetic field signature" and "magnetic signature" are interchangeable, each term broadly and synonymously referring to one or more magnetic fields or one or more components, portions or aspects thereof, or one or more magnetic field vectors or one or more components, portions or aspects thereof.

The present invention features inventively developed equations that relate magnetic gradiometric measurements over a closed surface to the prolate spheroidal multi-pole moments of an object. The present invention's formulations can be used to remove the uniform inducing field of a magnetic calibration facility's coil system, along with the earth's background field, from the signature of a large test item—without requiring that such large test item be moved.

In accordance with typical embodiments of the present invention, gradiometers are used for purposes of extrapolating and/or minimizing the static magnetic fields existing inside (within) a "source-free volume." The extrapolation and/or minimization of the static magnetic fields is/are accomplished based on gradiometric measurements taken over the surface that inwardly bounds the source-free volume. The source-free volume is the entire three-dimensional space extending outwardly, into infinity in all directions, from the closed surface. The present invention's methodology can be applied to other types of vector fields.

By practicing the present invention's methodology described in this disclosure, the magnetic fields within a source-free volume can be extrapolated or computed based on gradiometric measurements over its bounding surface. The present invention's technique allows the inducing magnetic field (the earth's magnetic field and/or the testing facility's applied field) to be removed from the measurements without physically separating the sensors from the magnetic object. The inventive method should increase the accuracy of extrapolating or canceling the magnetic field signature of large objects.

An inventive example is given herein that shows how the equations can be used to determine the optimum number, orientations and positions of gradiometers for accurate extrapolation of the object's field signatures. In addition, generalized boundary conditions have been established herein that guarantee unique extrapolations of magnetic field, up to an additive constant, from a closed measurement surface instrumented only with gradiometers.

The present invention obviates the need for moving a test object for the purpose of removing the inducing coil's applied uniform field from the object's magnetic signature. A magnetic gradiometer can subtract the applied background field from an object's signature. Since the applied flux at Carderock's new coil facility is uniform over the small dimensions of the gradiometer (better than 10 nT/m), and since the worse case noise of a commercial gradiometer due to alignment error is better than 75 nT/m (See aforementioned Gradiometer Type GS2, ULTRA Electronics Magnetics Division, Fallow Park, Rugely Road, Hednesford, Cannock, Staffordshire, England WS12 5QZ), sufficient signal-to-noise can be obtained from close-in measurements of a test object's field gradients.

Incorporated herein by reference is the following published paper, authored by one of the joint inventors, which discloses various aspects of the present invention: John J. Holmes, "Theoretical development of laboratory techniques for magnetic measurement of large objects," *IEEE Transactions on Magnetics*, vol. 37, no. 5, September 2001, pages 3790–3797.

Other objects, advantages and features of this invention will become apparent from the following detailed description of the invention when considered in conjunction with the accompanying drawings.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

In order that the present invention may be clearly understood, it will now be described, by way of example, with reference to the accompanying drawings, wherein like numbers indicate the same or similar components, and wherein.

DETAILED DESCRIPTION OF THE INVENTION

Field Measurements over a Closed Prolate Spheroidal Surface

The boundary conditions for magnetic fields that guarantee a unique solution to Laplace's equation inside a source-free volume enclosed by the bounding surface are well known. For the calibration problem at hand the source free region extends from the closed measurement surface out to infinity. If none of the test item's magnetic material or sources extend into the source-free region, then the magnetic field, $\overline{H}$, in this volume can be represented by a magnetic scalar potential, $\Psi_m$, so that $$\overline{H} = -\nabla \Psi_m \quad (1)$$

Inserting this representation for the magnetic field into Maxwell's equations yields Laplace's equation for the magnetic potential in a source-free region $$\nabla^2 \Psi_m = 0 \quad (2)$$

There are several types of boundary conditions that can be specified over the measurement surface that guarantee a unique solution for equation (2), and for those fields extrapolated into the surrounding space.

Figure 1:
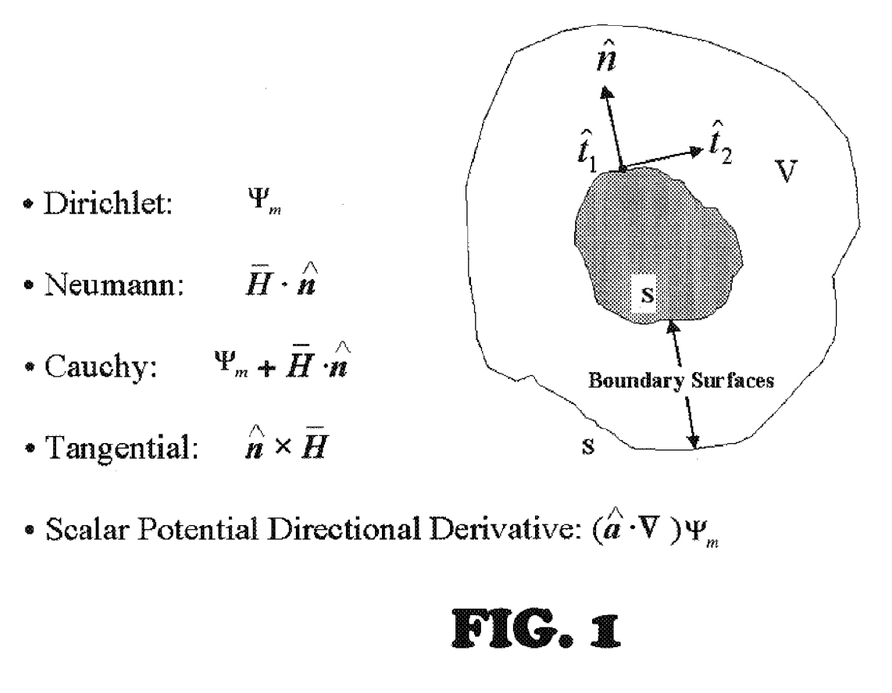
FIG. 1 is a diagrammatic representation of standard magnetic scalar potential and field boundary conditions for Laplace's equation.

Referring now to FIG. 1, one of the many types of boundary conditions that can be used to obtain a unique solution to Laplace's equation is the Dirichlet condition. As shown in FIG. 1, the Dirichlet boundary condition specifies the magnetic potential, $\Psi_m$, on the bounding surface, while the Neumann boundary condition specifies the gradient in potential along the unit normal to the boundary surface that points into the volume, which from equation (1) is equal to the normal component in magnetic field, $H_n$. The Cauchy condition fixes the potential over part of the surface and the normal gradient over the rest, $\Psi_m + H_n$. Also, it has been shown that knowing the directional derivative of the scalar potential, $(\hat{a} \cdot \nabla)\Psi_m$ or $\hat{a} \cdot \overline{H}$, in a specific direction along a unit vector, $\hat{a}$, is sufficient under certain circumstances. See the following U.S. Navy technical report and paper, each of which is incorporated herein by reference: J. C. W. Rogers, "Determination of the magnetic field beneath a plane by measurement of the oblique field component on the plane", NSWCW/WOL TR 76-28, Naval Surface Warfare Center, Silver Spring, Md., March 1976; D. K. Palagachev and P. R. Popivanov, "Sub-elliptic boundary value problems for quasilinear elliptic operators," *Elec. Jou. of Diff. Eq.*, vol. 1, pp 1–12, 1997.

It is also possible to obtain a unique solution to equation (2) by specifying over the surface of the boundary the tangential components of magnetic field given by $\hat{n} \times \overline{H}$. See D. T. Paris and F. K. Hurd, *Basic Electromagnetic Theory*, New York: McGraw-Hill Inc, 1969, p 165, incorporated herein by reference. However, two orthogonal tangential field components must be measured to ensure that the $\hat{n} \times \overline{H}$ boundary condition is completely specified. If only the tangential components of magnetic field are to be specified, then both orthogonal tangential components are, in general, required, $\hat{n} \times \overline{H}$. In general, measuring the tangential components of magnetic field over a closed surface will require twice as many sensors and data channels as the normal component, $H_n$.

Since the scalar magnetic potential cannot be measured directly, the Dirichlet and Cauchy boundary conditions cannot be applied to the problem at hand. The magnetic field measured by a total-field (scalar) magnetometer is approximately equal to its dot product with the earth's magnetic field if the test item's field is small in comparison. Under these circumstances, the directional derivative of the scalar potential could be used as a boundary condition. However, the small signal assumption does not always hold when the measurement surface is located near a magnetic item with a large field.

Extrapolation of Magnetic Field Measurements from a Closed Prolate Spheroidal Surface There are many techniques available for extrapolating magnetic fields from a surface to inside its enclosed volume. Numerical algorithms that extrapolate fields or potentials from an arbitrary shaped boundary are part of many boundary integral and boundary element software packages. See, e.g., J. Trevelyan, *Boundary Elements for Engineers: Theory and Applications*, WIT Press, 1994, incorporated herein by reference. Another approach to field extrapolation is to compute the equivalent source strengths of a multi-pole expansion, using the measured field over the closed surface as input, and then to re-compute the fields at other locations inside the source-free volume. The later technique has been used successfully to extrapolate laboratory, scale, and full-scale magnetic measurements of satellites and naval vessels. See aforementioned paper T. N. Roy, "Spacecraft magnetic field modeling," *IEEE Trans. Magn.*, vol. 13, pp 914–919, January 1977. See also the following paper and technical reports, each of which is incorporated herein by reference: M. Lackey, "Computer programs for the analysis of spacecraft magnetism," NSWC/WOL TR 73-191, Naval Surface Warfare Center, Silver Spring, Md., September 1973; M. Lackey, "Computer programs for harmonic analysis of magnetic model data," NSWC TR 81-423, Naval Surface Warfare Center, Silver Spring, Md., December 1982; D. A. Nixon and F. E. Baker, "Using prolate spheroidal magnetization distributions for magnetic modeling," *Jou. Appl. Phy.*, vol. 52, pp 539–541, 1981; K. R. Allen and R. I. Joseph, "On the estimation of the magnetic and electric multi-pole moments of ocean vessels," JHU/APL Technical Report STD-R-1538, December 1987.

Prolate spheroidal multi-pole modeling and field extrapolation will be introduced in this subsection, and extended later herein when gradiometric boundary surface measurements are considered.

Prolate spheroidal coordinate systems/multi-pole expansions are typically used to model naval vessels. Out of all the coordinate systems for which Laplace's equation is separable, the prolate spheroidal more closely matches the shape of a ship's hull, which generally has a large length to beam (diameter) ratio. This selection in coordinate system allows the vessel's signature, or scale model's signature, to be accurately reproduced at distances close to its hull with the minimal number of multi-pole terms. In addition, a prolate spheroidal surface can be matched to most items tested in the laboratory, and can be easily reduced to a sphere if required.

Figure 2:
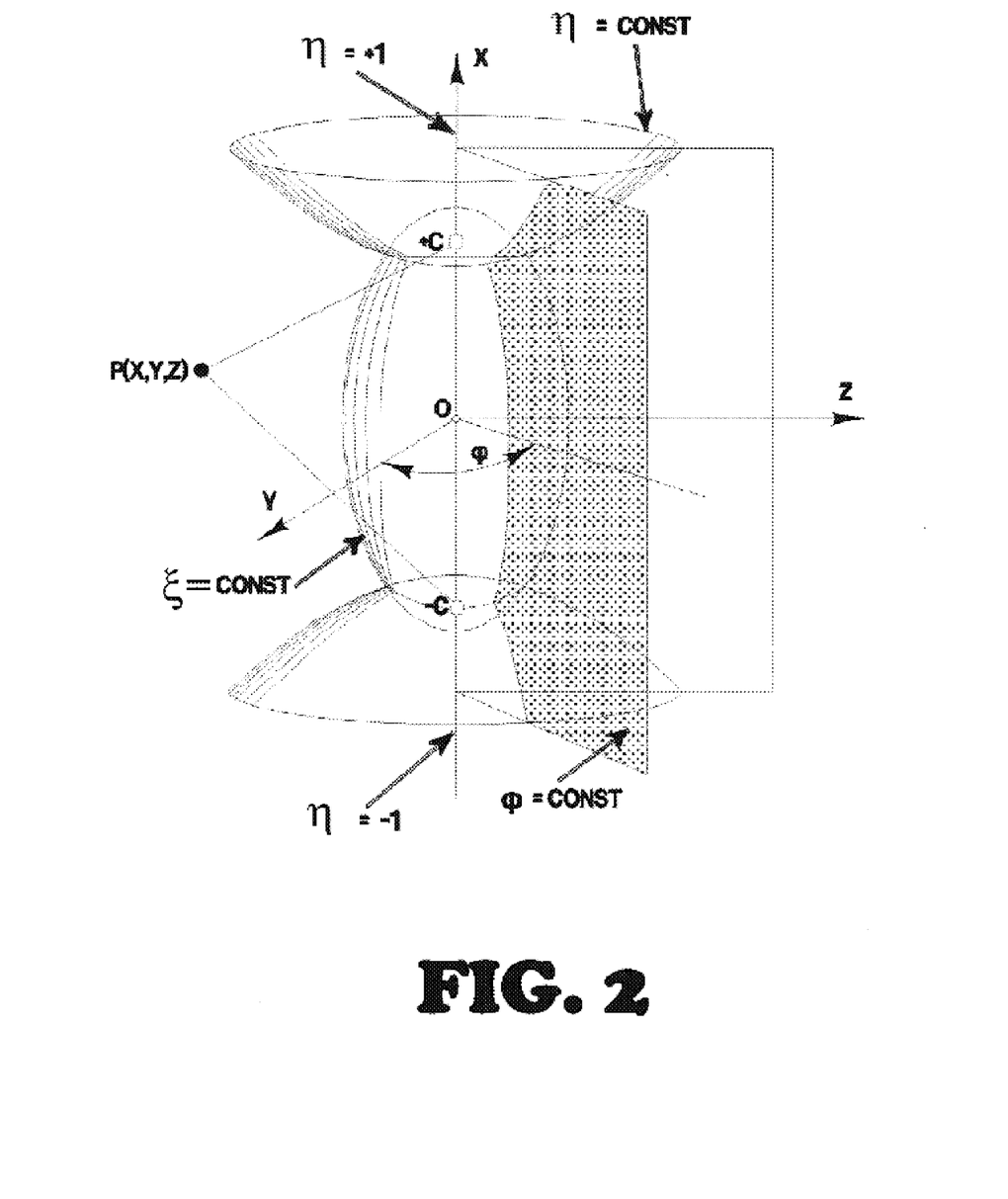
FIG. 2 is a diagrammatic representation of a prolate spheroidal coordinate system.

The derivation of the relationships between the prolate spheroidal multi-pole moments and the magnetic field components on the surface of a spheroidal boundary begins with Laplace's equation for the magnetic scalar potential, viz., equation (2). The general solution to Laplace's equation in prolate spheroidal coordinates is given by G. Arfken, *Mathematical Methods for Physicists,* New York: Academic Press, 1970, incorporated herein by reference, as follows:

$$\Psi_m = \frac{1}{4\pi}\sum_{n=0}^{\infty}\sum_{m=0}^{n}(\alpha_{nm}A_{nm} + \beta_{nm}B_{nm}) \quad (3)$$

where $\alpha_{nm} = P_n^m(\eta)Q_n^m(\xi)\cos m\phi$ $\beta_{nm} = P_n^m(\eta)Q_n^m(\xi)\sin m\phi$ $\xi = \frac{(r_1 + r_2)}{2c} \quad ; \xi \geq 1$ $\eta = \frac{(r_1 - r_2)}{2c} \quad ; -1 \leq \eta \leq 1$ $\tan\varphi = \frac{z}{y} \quad ; 0 \leq \varphi \leq 2\pi$ $r_1 = [(x+c)^2 + y^2 + z^2]^{1/2}$ $r_2 = [(x-c)^2 + y^2 + z^2]^{1/2}$ $x = c\xi\eta$ $y = c[(\xi^2-1)(1-\eta^2)]^{1/2} \cos\phi$ $z = c[(\xi^2-1)(1-\eta^2)]^{1/2} \sin\phi$ and c, x, y, z, $\eta$, $\xi$, and $\phi$ are defined in FIG. 2, $A_{nm}$ and $B_{nm}$ are the prolate spheroidal multi-pole source strengths or moments; and where $P_n^m(\eta)$ and $Q_n^m(\eta)$ are the associated Legendre polynomials of the first and second kind, respectively. The metrics for the prolate spheroidal coordinate system are $h_\xi = \frac{c(\xi^2 - \eta^2)^{1/2}}{(\xi^2 - 1)^{1/2}}$ $h_\eta = \frac{c(\xi^2 - \eta^2)^{1/2}}{(1 - \eta^2)^{1/2}}$ Equation (3) is obtained if Laplace's equation is solved in prolate spheroidal coordinates using the separation-of-variables technique.

The gradients of the scalar potentials in curvilinear coordinate systems are computed differently than in the Cartesian system. Negative gradients of the magnetic scalar potential in prolate spheroidal coordinates can be computed as disclosed in the aforementioned book G. Arfken, *Mathematical Methods for Physicists,* New York: Academic Press, 1970.

$$H_\xi(r) = -\frac{1}{h_\xi}\frac{\partial\Psi_m}{\partial\xi} \quad (4)$$

$$H_\varphi(r) = -\frac{1}{h_\varphi}\frac{\partial\Psi_m}{\partial\varphi} \quad (5)$$

$$H_\eta(r) = -\frac{1}{h_\eta}\frac{\partial\Psi_m}{\partial\eta} \quad (6)$$

Placing equation (3) into equations (4) through (6) results in $$H_\xi(r) = \frac{-1}{4\pi}\sum_{n=0}^{\infty}\sum_{m=0}^{n}(A_{nm}\cos m\varphi + B_{nm}\sin m\varphi)P_n^m(\eta)\frac{Q_n^{m'}(\xi)}{h_\xi} \quad (7)$$

$$H_\varphi(r) = \frac{-1}{4\pi}\sum_{n=0}^{\infty}\sum_{m=0}^{n}(-A_{nm}m\sin m\varphi + B_{nm}m\cos m\varphi)P_n^m(\eta)\frac{Q_n^m(\xi)}{h_\varphi} \quad (8)$$

$$H_\eta(r) = \frac{-1}{4\pi}\sum_{n=0}^{\infty}\sum_{m=0}^{n}(A_{nm}\cos m\varphi + B_{nm}\sin m\varphi)P_n^{m'}(\eta)\frac{Q_n^m(\xi)}{h_\eta} \quad (9)$$

The objective is to solve for the $A_{nm}$ and $B_{nm}$ multi-pole source strengths of equations (7) through (9) in terms of $H_\xi$, $H_\varphi$, and $H_\eta$.

Following the procedure found in M. Lackey, "Computer programs for the analysis of spacecraft magnetism," NSWC/WOL TR 73-191, Naval Surface Warfare Center, Silver Spring, Md., September 1973, incorporated herein by reference, and M. Lackey, "Computer programs for harmonic analysis of magnetic model data," NSWC TR 81-423, Naval Surface Warfare Center, Silver Spring, Md., December 1982, incorporated herein by reference, the orthogonality properties of trigonometric functions and the associated Legendre polynomial of the first kind were used to separate each moment term from the remainder of the series. The relationships between boundary surface triaxial field vector measurements ($H_\xi$, $H_\varphi$, and $H_\eta$) and a test object's prolate spheroidal multi-pole moments have been formulated in accordance with the present invention. These relationships are summarized hereinbelow as $$A_{nm} = C_{nm}\int_0^{2\pi}\int_{-1}^{1}H_\xi(r_0)P_n^m(\eta)(\xi_0^2 - \eta^2)\cos m\varphi\,d\eta\,d\varphi \quad (10)$$

$$B_{nm} = \frac{\varepsilon_m}{\varepsilon_m'}C_{nm}\int_0^{2\pi}\int_{-1}^{1}H_\xi(r_0)P_n^m(\eta)(\xi_0^2 - \eta^2)^{1/2}\sin m\varphi\,d\eta\,d\varphi \quad (11)$$

for the $H_\xi$ component, $$A_{nm} = D_{nm}\int_0^{2\pi}\int_{-1}^{1}H_\varphi(r_0)P_n^m(\eta)(1 - \eta^2)^{1/2}\sin m\varphi\,d\eta\,d\varphi \quad (12)$$

$$B_{nm} = -D_{nm}\frac{\varepsilon_m'}{\varepsilon_m}\int_0^{2\pi}\int_{-1}^{1}H_\varphi(r_0)P_n^m(\eta)(1 - \eta^2)^{1/2}\cos m\varphi\,d\eta\,d\varphi \quad (13)$$

for the $H_\varphi$ component, and $$A_{nm} = E_{nm}\int_0^{2\pi}\int_{-1}^{1}H_\eta(r_0)P_n^m(\eta)(\xi_0^2 - \eta^2)^{1/2}(1 - \eta^2)^{1/2}\cos m\varphi\,d\eta\,d\varphi + A_{n-2,m}F_{nm} \quad (14)$$

-continued $$B_{nm} = \tag{15}$$

$$E_{nm}\frac{\varepsilon_m}{\varepsilon'_m}\int_0^{2\pi}\int_{-1}^{1} H_\eta(r_0)P_{n-1}^m(\eta)(\xi_0^2-\eta^2)^{1/2}(1-\eta^2)^{1/2}\sin m\varphi\, d\eta\, d\varphi +$$

$$B_{n-2,m}F_{nm}$$

for the $H_\eta$ component, where $$C_{nm} = \frac{-2c(2n+1)(n-m)!}{\varepsilon_m Q_n^{m\prime}(\xi_0)(\xi_0^2-1)^{1/2}(n+m)!}$$

$$D_{nm} = \frac{2c(\xi_0^2-1)^{1/2}(2n+1)(n-m)!}{\varepsilon'_m Q_n^m(\xi_0)m(n+m)!}$$

$$E_{nm} = \frac{-c(8n^2-2)(n-m-1)!}{\varepsilon_m Q_n^m(\xi_0)(n+1)(n+m)(n+m-1)!}$$

$$F_{nm} = \frac{Q_{n-2}^m(\xi_0)(2n+1)(n-2)(n-m-1)}{Q_n^m(\xi_0)(n+1)(n+m)(2n-3)}$$

$$\varepsilon_m = \begin{cases} 1 & \text{for } m \neq 0 \\ 2 & \text{for } m = 0 \end{cases}$$

$$\varepsilon'_m = \begin{cases} 1 & \text{for } m \neq 0 \\ 0 & \text{for } m = 0 \end{cases}$$

and where $A_{n-2,m}=B_{n-2,m}=0$, for n−2<m in the equations using $H_\eta$, $\xi_0$ corresponds to a fixed prolate spheroidal surface representing the measurement surface, and all other geometrical terms have been defined previously.

Once the multi-pole moments have been determined from field recordings taken over the measurement surface, all triaxial components can then be computed inside the source-free volume with equations (7) through (9). It should be noted that none of the equations can be used to find a value for $B_{n0}$. However, $B_{n0}$ does not correspond to a real multi-pole moment, and therefore, is not required. See D. A. Nixon, "Mathematically modeling magnetic field sources," DTRC Report PAS-78-7, David Taylor Research Center, Annapolis, Md., May 1978, incorporated herein by reference.

Unlike $B_{n0}$, the $A_{n0}$ terms are important but cannot be obtained with only measurements of the $\phi$ component of magnetic field (See equations (12) and (13)). This term must be obtained from the $H_\eta$ component. Also, when equations (14) and (15) are examined it becomes obvious that for odd values of n there are too few equations to solve for the number of unknown A and B terms. Therefore, to uniquely determine all the multi-pole moments, and their resulting extrapolated fields, both the $H_\eta$ and $H_\phi$ components must be measured. This is how the general tangential component boundary condition uniqueness requirement, that states both tangential field components are needed, manifests itself for the $H_\eta$ and $H_\phi$ components in the prolate spheroidal coordinate system.

Generalized Boundary Conditions for Gradiometric Measurements (Directional Derivatives) over a Closed Surface As discussed previously herein, the magnetic field non-uniformity applied by the Carderock coil facility is small and may be neglected over the space occupied by the object under test, and over the measurement surface near the item. Little of the facility's applied uniform field is seen by a gradiometer, which approximates the directional derivative of the magnetic field vector. In prolate spheroidal coordinates, the directional derivatives are given by $$D_{\xi\xi}(r) = \frac{1}{h_\xi}\left[\frac{\partial H_\xi}{\partial \xi} + H_\eta \frac{1}{h_\eta}\frac{\partial h_\xi}{\partial \eta}\right] \tag{16}$$

$$D_{\eta\xi}(r) = \frac{1}{h_\xi}\left[\frac{\partial H_\eta}{\partial \xi} - H_\xi \frac{1}{h_\eta}\frac{\partial h_\xi}{\partial \eta}\right] \tag{17}$$

$$D_{\varphi\xi}(r) = \frac{1}{h_\xi}\frac{\partial H_\varphi}{\partial \xi} \tag{18}$$

$$D_{\xi\eta}(r) = \frac{1}{h_\eta}\left[\frac{\partial H_\xi}{\partial \eta} - H_\eta \frac{1}{h_\xi}\frac{\partial h_\eta}{\partial \xi}\right] \tag{19}$$

$$D_{\eta\eta}(r) = \frac{1}{h_\eta}\left[\frac{\partial H_\eta}{\partial \eta} + H_\xi \frac{1}{h_\xi}\frac{\partial h_\eta}{\partial \xi}\right] \tag{20}$$

$$D_{\varphi\eta}(r) = \frac{1}{h_\eta}\frac{\partial H_\varphi}{\partial \eta} \tag{21}$$

$$D_{\xi\varphi}(r) = \frac{1}{h_\varphi}\left[\frac{\partial H_\xi}{\partial \varphi} - H_\varphi \frac{1}{h_\xi}\frac{\partial h_\varphi}{\partial \xi}\right] \tag{22}$$

$$D_{\eta\varphi}(r) = \frac{1}{h_\varphi}\left[\frac{\partial H_\eta}{\partial \varphi} - H_\varphi \frac{1}{h_\eta}\frac{\partial h_\varphi}{\partial \eta}\right] \tag{23}$$

$$D_{\varphi\varphi}(r) = \frac{1}{h_\varphi}\left[\frac{\partial H_\varphi}{\partial \varphi} + H_\xi \frac{1}{h_\xi}\frac{\partial h_\varphi}{\partial \xi} + H_\eta \frac{1}{h_\eta}\frac{\partial h_\varphi}{\partial \eta}\right] \tag{24}$$

Equations (16) through (24) are the basic formulations for defining gradiometric measurements over a prolate spheroidal surface enclosing the test object. (It should be noted that only five of the nine components are independent of each other.) To ensure the uniqueness of the magnetic fields extrapolated from gradiometric measurements will require the derivation of general gradiometric boundary conditions.

As discussed herein in the previous subsection, if the component of magnetic field that is normal to a closed surface is measured, or if the two tangential components are recorded, then unique magnetic field signatures can be extrapolated into the infinitely extending source-free volume which surrounds the closed surface and is inwardly delimited thereby. Analogous boundary conditions have been derived for magnetic gradiometric measurements over a closed surface. See J. J. Holmes, "Boundary conditions for magnetic field gradients inside a source-free volume," NSWCCD-TR-1999/007, Naval Surface Warfare Center, West Bethesda, Md., April 1999, incorporated herein by reference. It turns out that specifying the three magnetic field directional derivatives in the normal direction over a closed surface around a source-free volume is, in general, a sufficient, but not a necessary condition to ensure a unique extrapolation of all nine gradiometric components. For the prolate spheroidal coordinate system the three surface-normal gradiometric components are $D_{\xi\xi}$, $D_{\phi\xi}$, and $D_{\eta\xi}$.

Similarly, specifying the six magnetic field directional derivatives in the two orthogonal tangential directions over a closed surface demarcating a source-free volume is also, in general, a sufficient, but not necessary condition to ensure a unique extrapolation of all nine gradiometric components. For the prolate spheroidal system, the six tangential components are $D_{\xi\eta}$, $D_{\phi\eta}$, $D_{\eta\eta}$, $D_{\xi\phi}$, $D_{\phi\phi}$, and $D_{\eta\phi}$. Also, the magnetic fields extrapolated from gradiometric measurements are unique up to an arbitrary constant. However, the test item cannot produce a spatially constant magnetic field from its surface out to infinity. The magnetic signature of the item must fall off with radial distance at least as fast as a dipole, which falls as the inverse cube of range. Therefore, the arbitrary constant can be set to zero for the problem at hand.

State-of-the-art gradiometers use two triaxial magnetometers mounted on a rigid bar and separated by a distance of 0.3 to 1 m. An example is the aforementioned Gradiometer Type GS2, ULTRA Electronics Magnetics Division, Fallow Park, Rugely Road, Hednesford, Cannock, Staffordshire, England WS12 5QZ. As a result, one axis of each magnetometer is located in the $1^{st}$ Gaussian position, which could for example measure $D_{\xi\xi}$; the other four axes are located in the $2^{nd}$ Gaussian position, and in this example measure $D_{\phi\xi}$ and $D_{\eta\xi}$. Therefore, to satisfy the uniqueness conditions for gradiometric measurements over a closed surface requires only a single array of gradiometers mounted in the surface-normal direction. On the other hand, if the sensors are to be mounted in the direction tangential to the closed surface, then two gradiometers would be required at each measurement point, and they must be aligned orthogonally. The optimum number and position of the gradiometers in the array will be discussed later herein.

Gradiometer Measurements Over a Closed Prolate Spheroidal Surface

To extrapolate the magnetic fields of a test object from gradiometric measurements in a large coil facility will require the derivation of relationships between the prolate spheroidal multi-pole moments and their directional derivative components. First, place equations (7) through (9) into equations (16) through (24). Then, as was done to formulate equations (10) through (15), use the orthogonality properties of trigonometric functions and the associated Legendre polynomial of the first kind to separate each moment term from the remainder of the series. The resulting relationships between the prolate spheroidal multi-pole moments and the directional derivatives of their magnetic fields can be summarized as:

$$A_{nm} = E_{nm} \int_{-1}^{1} \int_{0}^{2\pi} D_{\phi\xi}(r_0) P_n^m(\eta)(\xi_0^2 - \eta^2)^{1/2} \cdot (1-\eta^2)^{1/2} \sin m\phi \, d\phi \, d\eta \quad (25)$$

$$B_{nm} = -E_{nm} \frac{\varepsilon_m'}{\varepsilon_m} \int_{-1}^{1} \int_{0}^{2\pi} D_{\phi\xi}(r_0) P_n^m(\eta)(\xi_0^2 - \eta^2)^{1/2} \cdot (1-\eta^2)^{1/2} \cos m\phi \, d\phi \, d\eta \quad (26)$$

and the $D_{\phi\xi}$ term in (25) and (26) can be replaced with $D_{\xi\phi}$, $$A_{nm} = F_{nm} \int_{-1}^{1} \int_{0}^{2\pi} D_{\phi\eta}(r_0) P_{n-1}^m(\eta)(\xi_0^2 - \eta^2)^{1/2} \cdot (1-\eta^2) \sin m\phi \, d\phi \, d\eta - G_{nm} A_{n-2,m} \quad (27)$$

$$B_{nm} = -F_{nm} \frac{\varepsilon_m'}{\varepsilon_m} \int_{-1}^{1} \int_{0}^{2\pi} D_{\phi\eta}(r_0) P_{n-1}^m(\eta)(\xi_0^2 - \eta^2)^{1/2} \cdot (1-\eta^2) \cos m\phi \, d\phi \, d\eta - G_{nm} B_{n-2,m} \quad (28)$$

where $n \geq m+1$, and the $D_{\phi\eta}$ term in (27) and (28) can be replaced with $D_{\eta\phi}$, $$A_{nm} = H_{nm} \int_{-1}^{1} \int_{0}^{2\pi} D_{\eta\xi}(r_0) P_{n-3}^m(\eta)(\xi_0^2 - \eta^2)^2 \cdot (1-\eta^2)^{1/2} \cos m\phi \, d\phi \, d\eta - \quad (29)$$
$$I_{nm} A_{n-6,m} - J_{nm} A_{n-4,m} - K_{nm} A_{n-2,m}$$

$$B_{nm} = H_{nm} \frac{\varepsilon_m}{\varepsilon_m'} \int_{-1}^{1} \int_{0}^{2\pi} D_{\eta\xi}(r_0) P_{n-3}^m(\eta)(\xi_0^2 - \eta^2)^2 \cdot (1-\eta^2)^{1/2} \sin m\phi \, d\phi \, d\eta - \quad (30)$$
$$I_{nm} B_{n-6,m} - J_{nm} B_{n-4,m} - K_{nm} B_{n-2,m}$$

where $n \geq m+3$, and the $D_{\eta\xi}$ term in (29) and (30) can be replaced with $D_{\xi\eta}$, $$A_{nm} = L_{nm} \int_{-1}^{1} \int_{0}^{2\pi} D_{\xi\xi}(r_0) P_{n-2}^m(\eta)(\xi_0^2 - \eta^2)^2 \cdot \cos m\phi \, d\phi \, d\eta - \quad (31)$$
$$M_{nm} A_{n-4,m} - N_{nm} A_{n-2,m}$$

$$B_{nm} = L_{nm} \frac{\varepsilon_m}{\varepsilon_m'} \int_{-1}^{1} \int_{0}^{2\pi} D_{\xi\xi}(r_0) P_{n-2}^m(\eta)(\xi_0^2 - \eta^2)^2 \cdot \sin m\phi \, d\phi \, d\eta - \quad (32)$$
$$M_{nm} B_{n-4,m} - N_{nm} B_{n-2,m}$$

where $n \geq m+2$, and the $D_{\xi\xi}$ term in (31) and (32) can be replaced with $-(D_{\eta\eta} + D_{\phi\phi})$, $$A_{nm} = P_{nm} \int_{-1}^{1} \int_{0}^{2\pi} D_{\eta\eta}(r_0) P_{n-4}^m(\eta)(\xi_0^2 - \eta^2)^2 \cdot (1-\eta^2) \cos m\phi \, d\phi \, d\eta - \quad (33)$$
$$Q_{nm} A_{n-8,m} - R_{nm} A_{n-6,m} - S_{nm} A_{n-4,m} - T_{nm} A_{n-2,m}$$

$$B_{nm} = \quad (34)$$
$$P_{nm} \frac{\varepsilon_m}{\varepsilon_m'} \int_{-1}^{1} \int_{0}^{2\pi} D_{\eta\eta}(r_0) P_{n-4}^m(\eta)(\xi_0^2 - \eta^2)^2 \cdot (1-\eta^2) \sin m\phi \, d\phi \, d\eta -$$
$$Q_{nm} B_{n-8,m} - R_{nm} B_{n-6,m} - S_{nm} B_{n-4,m} - T_{nm} B_{n-2,m}$$

where $n \geq m+4$, and the $D_{\eta\eta}$ term in equations (33) and (34) can be replaced with $-(D_{\xi\xi} + D_{\phi\phi})$, $$A_{nm} = U_{nm} \int_{-1}^{1} \int_{0}^{2\pi} D_{\phi\phi}(r_0) P_{n-2}^m(\eta)(\xi_0^2 - \eta^2) \cdot (1-\eta^2) \cos m\phi \, d\phi \, d\eta - \quad (35)$$
$$V_{nm} A_{n-4,m} - W_{nm} A_{n-2,m}$$

-continued $$B_{nm} = \qquad (36)$$

$$U_{nm}\frac{\varepsilon_m}{\varepsilon'_m}\int_{-1}^{1}\int_{0}^{2\pi}D_{\varphi\varphi}(r_0)P_{n-2}^{m}(\eta)(\xi_0^2-\eta^2)\cdot(1-\eta^2)\sin m\varphi\,d\varphi\,d\eta -$$

$$V_{nm}B_{n-4,m} - W_{nm}B_{n-2,m}$$

where $n \geq m+2$, and the $D_{\varphi\varphi}$ term in equations (33) and (34) can be replaced with $-(D_{\eta\eta}+D_{\xi\xi})$. (In all equations, $A_{nm}=B_{nm}=0$ for n<m, and as before, $\xi=\xi_0$ represents the prolate spheroidal measurement surface.) The remaining terms used in equations (25) through (36) are listed hereinbelow in the section entitled "Mathematical Terms and Definitions," and all other geometrical terms are defined previously herein.

No single pair of gradiometric equations are sufficient by themselves to solve for all A and B terms. However, close examination of equations (25) through (36) shows that measuring only the $D_{\xi\xi}$, $D_{\varphi\xi}$, and $D_{\eta\xi}$ components is sufficient to solve for all A and B terms, while recording $D_{\xi\eta}$, $D_{\varphi\eta}$, $D_{\eta\eta}$, $D_{\xi\varphi}$, $D_{\varphi\varphi}$, and $D_{\eta\varphi}$ also forms a sufficient set for tangentially oriented gradiometers. This is how the generalized gradiometric uniqueness boundary conditions manifest themselves in the prolate spheroidal coordinate system. Once the A and B terms have been determined from equations (25) through (36), then the triaxial magnetic fields of the test object can be computed or extrapolated into the surrounding space with equations (7) through (9).

A numerical simulation of the extrapolation process was conducted using the MATHCAD 2000 Professional software package (manufactured by MathSoft Engineering & Education, Inc., 101 Main Street, Cambridge, Mass. 02142-1521) to validate the accuracy of the prolate spheroidal gradiometric formulations. The prolate spheroidal moments of a ferromagnetic object up through the $10^{th}$ degree and $3^{rd}$ order (m=10 and n=3 in equations (7) through (9)) served as the test case. First, the directional derivatives of the object's fields were computed over a hypothetical prolate spheroidal measurement surface ($\xi_0$=1.3) using equations (7) through (9) and (16) through (24). The A and B terms were then computed using equations (25) through (36) and agreed with the original values with an accuracy better than 1 part in $10^8$.

The objective of the simulation was only to ensure that no mistakes were made in the formulations. (No noise was introduced into the computations.) It is well known that equations (10) through (15) are ill-conditioned (ill-posed), and lead to non-unique and unstable solutions in the presence of noise, experimental error, or computational inaccuracies. See D. A. Nixon, "Mathematically modeling magnetic field sources", DTRC Report PAS-78-7, David Taylor Research Center, Annapolis, Md., May 1978, incorporated herein by reference. These equations are solutions to a general class called integral equations of the first kind. Since equations (25) through (36) are also solutions to equations of the first kind, they are ill-conditioned.

Many techniques have been developed for stabilizing (regularizing) the solutions to integral equations of the first kind. Some of the early work can be found in the following papers, each of which is incorporated herein by reference: S. Twomey, "The application of numerical filtering to the solution of integral equations encountered in indirect sensing measurements," *Jou. Frank. Inst.*, vol. 279, no. 2, February 1965; C. A. Balanis and J. J. Holmes, "Application of Fourier transforms for microwave radiometric inversions," *IEEE Trans. Ant. Prop.*, vol. AP-22, pp 798–806, November 1975; O. N. Strand and E. R. Westwater, "Statistical estimation of the numerical solution of a Fredholm integral equation of the first kind," *Jou. Asoc. Comp Mach.*, vol. 15, no. 1, pp 100–114, January 1988. More recently, work in this area has been disclosed by A. A. Timonov, "Regularising algorithms for inverse modeling problems: anomaly detection and source localization", in *Proc. MARELEC* 1999, pp. 53–73, July 1999, incorporated by reference.

One of several regularization techniques employed in naval applications with magnetic field measurements involves constraining the solution with a weighted minimization of the energy in the moments, $$\sum_n \sum_m (A_{nm}^2 + B_{nm}^2) = \min.$$

It has been shown that accurate signature reconstruction with energy constrained moments can be obtained with equations (7) through (9) provided the extrapolation point is on or outside the original field measurement surface, $\xi \geq \xi_0$. Similar regularization techniques are required for gradiometric measurements.

Design of an Optimal Experimental Gradiometer Array

The gradiometric formulations (25) through (36) can be used to determine the optimum number, orientation, and position of gradiometers in a sensor array for signature extrapolation. As an example, assume that the degree and order of a test object's important prolate spheroidal moments are limited to 10 and 3, respectively. As shown above, the gradiometers in the array should be oriented around the prolate spheroidal measurement surface in the normal direction to minimize the required number and the overall cost of the system. Therefore, only equations (25), (26), and (29) through (32) are needed for this example.

If the maximum angular harmonic of interest for the test item is 3, then from equations (7) through (9) and (16) through (18), the maximum harmonic content of $D_{\xi\xi}$, $D_{\varphi\xi}$, and $D_{\eta\xi}$ are also 3. By the Nyquist criteria, the sampling requirements of the cosine transform portions of equations (25), (26), and (29) through (32) are 6 per revolution. However, the sine transforms also require a sampling rate of 6, and since the A terms are 90 degrees out-of-phase with the B, a total of 12 gradiometers are required in each ring of sensors to accurately quantify all terms up through m=3. The minimum number of sensor rings, and their optimum locations along the length of the test object must still be determined.

An examination of equations (25), (26) and (29) through (32) shows that, for this example, the maximum polynomial order of their integrands in the $\eta$ direction is 20. Numerical integration techniques will be used to convert the continuous integrations into ones with discrete sampling points in the $\eta$ direction, which correspond to discrete rings of gradiometric sensors. To integrate a $20^{th}$ order polynomial exactly, with no error, at least 21 sampling points (or in this case sampling rings) are needed if they are spaced uniformly or randomly along the integration interval. See E. Isaacson and H. B. Keller, *Analysis of Numerical Methods*, New York: John Wiley & Sons, 1966, incorporated herein by reference. However, if the sensors are located at the zeros of an $11^{th}$ order Legendre polynomial, then by Gaussian quadrature numerical integration rules, a $20^{th}$ order polynomial can be integrated exactly with only 11 sensor rings. This cuts the required number of facility gradiometers by almost half, from 320 to 176. Therefore, through proper placement of the sensor rings along the length of the test object, facility sensor costs could be reduced significantly.

Mathematical Terms and Definitions

This subsection includes the terms used in equations (25) through (36). The other terms are either defined in this subsection or hereinabove.

$$E_{nm} = \frac{2c^2(\xi_0^2 - 1)(2n + 1)(n - m)!}{m\varepsilon'_m(n + m)!(Q_n^{m\prime}(\xi_0)(\xi_0^2 - 1) - \xi_0 Q_n^m(\xi_0))}$$

$$F_{nm} = \frac{2c^2(\xi_0^2 - 1)^{1/2}(2n - 1)(n - m - 1)!}{\varepsilon'_m Q_n^m(\xi_0) a_{nm}^{[1]}(n + m - 1)!m}$$

$$G_{nm} = \frac{Q_{n-2}^m(\xi_0) b_{n-2,m}^{[1]}}{Q_n^m(\xi_0) a_{nm}^{[1]}}$$

$$H_{nm} = \frac{-2c^2(2n - 5)(n - m - 3)!}{\varepsilon_m(\xi_0^2 - 1)^{1/2}(n + m - 3)! a_{nm}^{[2]}}$$

$$I_{nm} = \frac{d_{n-6,m}^{[2]}}{a_{nm}^{[2]}}$$

$$J_{nm} = \frac{c_{n-4,m}^{[2]}}{a_{nm}^{[2]}}$$

$$K_{nm} = \frac{b_{n-2,m}^{[2]}}{a_{nm}^{[2]}}$$

$$L_{nm} = \frac{-2c^2(2n - 3)(n - m - 2)!}{\varepsilon_m a_{nm}^{[3]}(n + m - 2)!}$$

$$M_{nm} = \frac{c_{n-4,m}^{[3]}}{a_{nm}^{[3]}}$$

$$N_{nm} = \frac{b_{n-2,m}^{[3]}}{a_{nm}^{[3]}}$$

$$P_{nm} = \frac{-2c^2(2n - 7)(n - m - 4)!}{\varepsilon_m a_{nm}^{[4]}(n + m - 4)!}$$

$$Q_{nm} = \frac{e_{n-8,m}^{[4]}}{a_{nm}^{[4]}}$$

$$R_{nm} = \frac{d_{n-6,m}^{[4]}}{a_{nm}^{[4]}}$$

$$S_{nm} = \frac{c_{n-4,m}^{[4]}}{a_{nm}^{[4]}}$$

$$T_{nm} = \frac{b_{n-2,m}^{[4]}}{a_{nm}^{[4]}}$$

$$U_{nm} = \frac{-2c^2(\xi_0^2 - 1)(2n - 3)(n - m - 2)!}{\varepsilon_m a_{nm}^{[5]}(n + m - 2)!}$$

$$V_{nm} = \frac{c_{n-4,m}^{[5]}}{a_{nm}^{[5]}}$$

$$W_{nm} = \frac{b_{n-2,m}^{[5]}}{a_{nm}^{[5]}}$$

$$a_{nm}^{[1]} = a_{nm} + a'_{nm}$$

$$b_{nm}^{[1]} = b_{nm} - b'_{nm}$$

$$a_{nm}^{[2]} = -Q_n^{m\prime}(\xi_0)(f_{nm} + f'_{nm})$$

$$b_{nm}^{[2]} = Q_n^{m\prime}(\xi_0)(a_{nm} - g_{nm} - g'_{nm}) + (\xi_0^2 Q_n^{m\prime}(\xi_0) - \xi_0 Q_n^m(\xi_0)) a'_{nm}$$

$$c_{nm}^{[2]} = Q_n^{m\prime}(\xi_0)(b_{nm} - h_{nm} - h'_{nm}) - (\xi_0^2 Q_n^{m\prime}(\xi_0) - \xi_0 Q_n^m(\xi_0)) b'_{nm}$$

$$d_{nm}^{[2]} = -Q_n^{m\prime}(\xi_0)(j_{nm} + j'_{nm})$$

$$a_{nm}^{[3]} = -((\xi_0^2 - 1)Q_n^{m\prime\prime}(\xi_0) + \xi_0 Q_n^{m\prime}(\xi_0))c_{nm} - Q_n^m(\xi_0)c'_{nm}$$

$$b_{nm}^{[3]} = \xi_0^2(\xi_0^2 - 1)Q_n^{m\prime\prime}(\xi_0) + \xi_0 Q_n^{m\prime}(\xi_0) - ((\xi_0^2 - 1)Q_n^{m\prime\prime}(\xi_0) + \xi_0 Q_n^{m\prime}(\xi_0))d_{nm} - Q_n^m(\xi_0)d'_{nm}$$

$$c_{nm}^{[3]} = -((\xi_0^2 - 1)Q_n^{m\prime\prime}(\xi_0) + \xi_0 Q_n^{m\prime}(\xi_0))e_{nm} - Q_n^m(\xi_0)e'_{nm}$$

$$a_{nm}^{[4]} = -n(n + 1)Q_n^m(\xi_0)p_{nm} + 2Q_n^m(\xi_0)p'_{nm}$$

$$b_{nm}^{[4]} = -n(n + 1)Q_n^m(\xi_0)q_{nm} + (n(n + 1)(\xi_0^2 + 1)Q_n^m(\xi_0) - \xi_0(\xi_0^2 - 1)Q_n^{m\prime}(\xi_0))c_{nm} + 2Q_n^m(\xi_0)q'_{nm} + (\xi_0^2 + 1)Q_n^m(\xi_0)c'_{nm}$$

-continued $$c_{nm}^{[4]} = -((\xi_0^2 + 1)Q_n^m(\xi_0)(n(n+1) - m^2) - \xi_0(\xi_0^2 - 1)Q_n^{m\prime}(\xi_0)) +$$

$$(n(n+1)(\xi_0^2 + 1)Q_n^m(\xi_0) - \xi_0(\xi_0^2 - 1)Q_n^{m\prime}(\xi_0))d_{nm} - n(n+1)Q_n^m(\xi_0)r_{nm} + (\xi_0^2 + 1)Q_n^m(\xi_0)d_{nm}' + 2Q_n^m(\xi_0)r_{nm}'$$

$$d_{nm}^{[4]} = -n(n+1)Q_n^m(\xi_0)s_{nm} + (n(n+1)(\xi_0^2 + 1)Q_n^m(\xi_0) - \xi_0(\xi_0^2 - 1)Q_n^{m\prime}(\xi_0))e_{nm} + 2Q_n^m(\xi_0)s_{nm}' + (\xi_0^2 + 1)Q_n^m(\xi_0)e_{nm}'$$

$$e_{nm}^{[4]} = -n(n+1)Q_n^m(\xi_0)t_{nm} + 2Q_n^m(\xi_0)t_{nm}'$$

$$a_{nm}^{[5]} = (m^2 Q_n^m(\xi_0) - (\xi_0^2 - 1)\xi_0 Q_n^{m\prime}(\xi_0))c_{nm} - (\xi_0^2 - 1)Q_n^m(\xi_0)c_{nm}'$$

$$b_{nm}^{[5]} = -m^2 \xi_0^2 Q_n^m(\xi_0) + (\xi_0^2 - 1)\xi_0 Q_n^m(\xi_0) + (m^2 Q_n^m(\xi_0) - (\xi_0^2 - 1)\xi_0 Q_n^{m\prime}(\xi_0))d_{nm} - (\xi_0^2 - 1)Q_n^m(\xi_0)d_{nm}'$$

$$c_{nm}^{[5]} = (m^2 Q_n^m(\xi_0) - (\xi_0^2 - 1)\xi_0 Q_n^{m\prime}(\xi_0))e_{nm} - (\xi_0^2 - 1)Q_n^m(\xi_0)e_{nm}'$$

$$\varepsilon_m = \begin{cases} 1 & \text{for } m \neq 0 \\ 2 & \text{for } m = 0 \end{cases}$$

$$\varepsilon_m' = \begin{cases} 1 & \text{for } m \neq 0 \\ 0 & \text{for } m = 0 \end{cases}$$

$$a_{nm} = \frac{n+m}{2n+1}$$

$$b_{nm} = \frac{n-m+1}{2n+1}$$

$$c_{nm} = a_{nm} a_{n-1,m}$$

$$d_{nm} = a_{nm} b_{n-1,m} + b_{nm} a_{n+1,m}$$

$$e_{nm} = b_{nm} b_{n+1,m}$$

$$f_{nm} = a_{nm} a_{n-1,m} a_{n-2,m}$$

$$g_{nm} = a_{nm}(a_{n-1,m} b_{n-2,m} + a_{nm} b_{n-1,m} + b_{nm} a_{n+1,m})$$

$$h_{nm} = b_{nm}(a_{nm} b_{n-1,m} + b_{nm} a_{n+1,m} + b_{n+1,m} a_{n+2,m})$$

$$j_{nm} = b_{nm} b_{n+1,m} b_{n+2,m}$$

$$p_{nm} = a_{nm} a_{n-1,m} a_{n-2,m} a_{n-3,m}$$

$$q_{nm} = a_{nm} a_{n-1,m}(a_{n-2,m} b_{n-3,m} + a_{n-1,m} b_{n-2,m} + a_{nm} b_{n-1,m} + a_{n+1,m} b_{nm})$$

$$r_{nm} = a_{nm} b_{n-1,m}(a_{n-1,m} b_{n-2,m} + a_{nm} b_{n-1,m} + a_{n+1,m} b_{nm}) + a_{n+1,m} b_{nm}(a_{nm} b_{n-1,m} + a_{n+1,m} b_{nm} + a_{n+2,m} b_{n+1,m})$$

$$s_{nm} = b_{nm} b_{n+1,m}(a_{nm} b_{n-1,m} + a_{n+1,m} b_{nm} + a_{n+2,m} b_{n+1,m} + a_{n+3,m} b_{n+2,m})$$

$$t_{nm} = b_{nm} b_{n+1,m} b_{n+2,m} b_{n+3,m}$$

$$a_{nm}' = \frac{(n+1)(n+m)}{2n+1}$$

$$b_{nm}' = \frac{n(n-m+1)}{2n+1}$$

$$c_{nm}' = a_{nm}' a_{n-1,m}$$

$$d_{nm}' = a_{nm}' b_{n-1,m} - b_{nm}' a_{n+1,m}$$

$$e_{nm}' = -b_{nm}' b_{n+1,m}$$

$$f_{nm}' = a_{nm}' a_{n-1,m} a_{n-2,m}$$

$$g_{nm}' = a_{nm}' a_{n-1,m} b_{n-2,m} + a_{nm}(a_{nm}' b_{n-1,m} - b_{nm}' a_{n+1,m})$$

$$h_{nm}' = b_{nm}(a_{nm}' b_{n-1,m} - b_{nm}' a_{n+1,m}) - b_{nm}' b_{n+1,m} a_{n+2,m}$$

$$j_{nm}' = -b_{nm}' b_{n+1,m} b_{n+2,m}$$

$$p_{nm}' = a_{nm}' a_{n-1,m} a_{n-2,m} a_{n-3,m}$$

$$q_{nm}' = a_{n-1,m}(a_{nm}' a_{n-2,m} b_{n-3,m} + a_{nm}' a_{n-1,m} b_{n-2,m} + a_{nm}(a_{nm}' b_{n-1,m} - b_{nm}' a_{n+1,m}))$$

$$r_{nm}' = b_{n-1,m}(a_{nm}' a_{n-1,m} b_{n-2,m} + a_{nm}(a_{nm}' b_{n-1,m} - b_{nm}' a_{n+1,m})) + a_{n+1,m}(b_{nm}(a_{nm}' b_{n-1,m} - b_{nm}' a_{n+1,m}) - b_{nm}' a_{n+2,m} b_{n+1,m})$$

$$s_{nm}' = b_{n+1,m}(b_{nm}(a_{nm}' b_{n-1,m} - b_{n+1,m}' a_{n+1,m}) - b_{nm}' a_{n+2,m} b_{n+1,m} - b_{nm}' a_{n+3,m} b_{n+2,m})$$

$$t_{nm}' = -b_{nm}' b_{n+1,m} b_{n+2,m} b_{n+3,m}$$

Recapitulation

This disclosure demonstrates how, in accordance with the present invention, gradiometers can be used in the laboratory to extrapolate and/or minimize the static magnetic field signatures of large items. According to the present invention, a method is provided for extrapolating or computing the magnetic field or fields (or any vector field that satisfies Laplace's equation) inside (within the confines of) an infinitely extending source-free volume, from gradiometric measurements taken over the surface that inwardly bounds the source-free volume. Although such a surface describing a geometric prolate spheroidal shape has been emphasized herein, it is to be understood that inventive principles are applicable to a variety of three-dimensional geometric shapes which bound the source-free volume.

The present invention uniquely formulates useful mathematical relationships (equations (25) through (36)) between prolate spheroidal multipole moments and magnetic gradiometric measurements taken over a geometric prolate spheroidal surface; in this regard, directional derivatives (equations (16) through (24)) are formulated for representing the magnetic gradiometric measurements. The magnetic fields existing in the interior space of the geometric prolate spheroidal surface—and, hence, the magnetic signature existing in the space exterior to the geometric prolate spheroidal surface—are determined based on relationships (equations (7) through (9)) between the interior magnetic fields (and, hence, the exterior magnetic signature) and the prolate spheroidal multipole moments. The relational formulations (equations (25) through (36)) can also be used to optimize, for purposes of signature extrapolation, the magnetic field/gradiometer measurement scheme in terms of number, orientations and positions of the gradiometer sensors in a sensor array.

Figure 3:
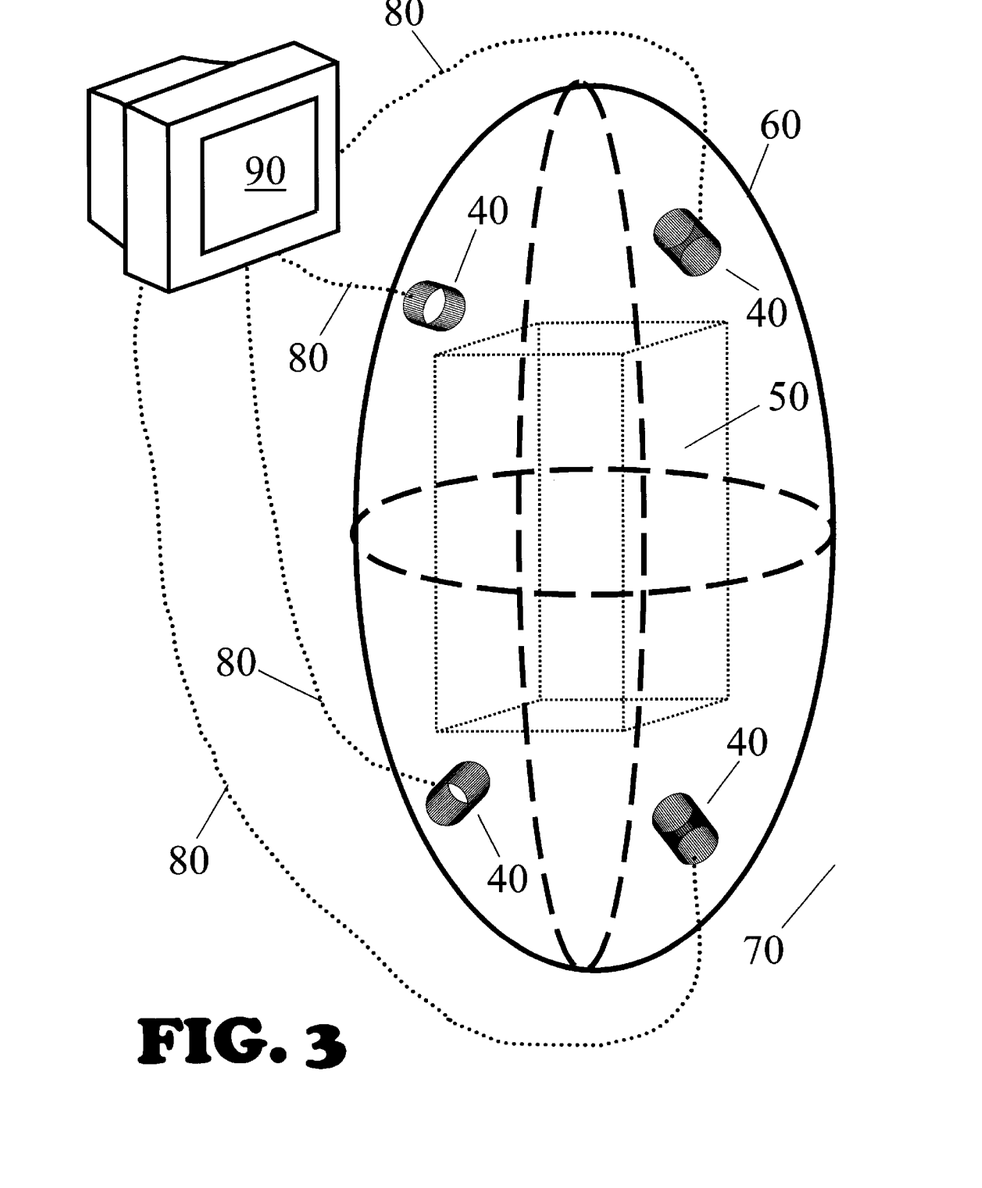
FIG. 3 is a diagrammatic representation of an embodiment of the present invention wherein gradiometric measurements are taken, from various locations on an imaginary surface describing a prolate spheroidal shape, of an object enclosed by the imaginary surface, and wherein the gradiometric measurements are processed in order to determine the magnetic fields (or magnetic signatures) of the object.

Reference now being made to FIG. 3, plural gradiometers (sensors) 40 are positioned outside of a test object 50 so that the gradiometers 40 generally define a closed prolate spheroidal surface 60 delimiting a source-free volume 70 which is outside of closed prolate spheroidal surface 60. Closed prolate spheroidal surface 60 is external to and encloses test object 50, and source-free volume 70 is external to and is delimited by closed prolate spheroidal surface 60. Gradiometers 40 are electrically connected, via wires/cables 80, to computer processor 90. Signals indicative of the respective measurements of gradiometers 40 are transmitted to processor 90, which contains a memory having information stored therein in accordance with the mathematical formulations of the present invention.

Processor 90 performs operations including the following: (i) using equations (16) through (24), processor 90 converts the gradiometric 40 measurements to (i.e., defines the gradiometric 40 measurements in terms of) directional derivatives; (ii) using equations (25) through (36), processor 90 relates the directional derivatives to prolate spheroidal multipole moments of test object 50 so as to find these prolate spheroidal multipole moments; and, (iii) using equations (7) through (9), processor 90 computes one or more magnetic fields (equivalently expressed, one or more magnetic field signatures, or magnetic signatures) in source-free volume 70 (i.e., in the entire space outside of prolate spheroidal surface 60)—e.g., by extrapolating the prolate spheroidal multipole moments into the magnetic field(s) or magnetic field signature(s).

Initially, prior to placement of gradiometers 40, a computer processor such as processor 90 can also be implemented, using equations (25) through (36), for purposes of optimization of the initial array gradiometers 40 with respect to the number of gradiometers 40 and/or the positions of gradiometers 40 and/or the orientations of gradiometers 40. The gradiometers 40 shown in FIG. 3 are shown for illustrative purposes only and should not be interpreted as suggesting optimality or preferability in any of these respects. In accordance with diverse inventive embodiments, the possibilities regarding the gradiometric array are infinite; the possible number of gradiometers is unlimited (e.g., it can be few or many), and their possible positions and orientations are each unlimited as well.

The present invention thus provides a methodology, and the theoretical development thereof, for measuring and extrapolating one or more magnetic field signatures (magnetic fields) of large items placed inside a coil facility. In accordance with typical embodiments of the present invention, gradiometers are used to remove the facility's applied field, along with the earth's background field, from signature measurements of items that cannot easily be removed from the coil. According to the present invention, mathematical equations have been derived and numerically verified that can be used to compute the prolate spheroidal multi-pole moments of the test object using only gradiometer measurements over a closed surface. From these moments, the magnetic field signatures can then be uniquely determined in the entire space outside the measurement surface.

In addition, an inventive example is given herein that demonstrates how the gradiometric prolate spheroid equations can be used to determine the optimal number, orientations, and positions of the gradiometer sensors within the array, resulting in almost a 50% reduction in facility hardware costs. Generalized boundary conditions, derived in the aforementioned U.S. Navy technical report J. J. Holmes, "Boundary conditions for magnetic field gradients inside a source-free volume", NSWCCD-TR-1999/007, Naval Surface Warfare Center, West Bethesda, Md., April 1999, have been inventively established that guarantee unique extrapolations of magnetic field from a closed measurement surface instrumented only with gradiometers. The generalized gradiometric boundary conditions are as follows: (i) The three magnetic field directional derivatives in the normal direction over a closed surface around a source-free volume is, in general, a sufficient, but not a necessary condition to ensure a unique extrapolation of all nine gradiometric components. (ii) The six magnetic field directional derivatives in the two orthogonal tangential directions over a closed surface around a source-free volume is also, in general, a sufficient, but not necessary condition to ensure a unique extrapolation of all nine gradiometric components.

The magnetic fields extrapolated from gradiometric measurements are unique up to an arbitrary constant. However, for the calibration coil problem at hand, the arbitrary constant can be set to zero.

There are other applications of the present invention, beyond its effectuation inside magnetic laboratory testing facilities. The inventive methodology can be applied to any circumstance where the earth's magnetic field cannot be separated from the measurement of an object's field. Also, the inventive methodology can be applied to other boundary value problems in physics where the force vector inside a volume must be extrapolated from the directional derivative of the force vector over the surface bounding the volume.

Although not described in the instant disclosure, it may be possible to develop a numerical technique, similar to those used in Boundary Element Modeling, to directly extrapolate magnetic field signatures from gradiometric measurements on an arbitrary surface, bypassing the intermediate step of computing multi-pole moments. Such a formulation would require the mathematical derivation of an analogue to Green's Theorem for directional derivatives of vectors. A general gradiometric, numerical, extrapolation technique of this type may find applications beyond magnetics.

Other embodiments of this invention will be apparent to those skilled in the art from a consideration of this specification or practice of the invention disclosed herein. Various omissions, modifications and changes to the principles described herein may be made by one skilled in the art without departing from the true scope and spirit of the invention which is indicated by the following claims.

What is claimed is:

1. A method for determining at least one magnetic field signature of an entity, said method comprising performing gradiometric measurements and processing said gradiometric measurements, wherein said performing of said gradiometric measurements includes using plural gradiometers which are arranged so as to generally describe a closed three-dimensional geometric shape which surrounds said entity, and wherein said processing of said gradiometric measurements includes, based on said gradiometric measurements, determining the multipole moments of said entity, said multipole moments corresponding to said closed three-dimensional geometric shape.

2. The method according to claim 1, wherein said method further comprises, based on said multipole moments, determining at least one magnetic field of said entity which is exterior of said closed three-dimensional geometric shape.

3. The method according to claim 1, wherein said determining said multipole moments includes relating, to said multipole moments, the directional derivatives corresponding to said gradiometric measurements.

4. The method according to claim 1, wherein said method further comprises, prior to said performing of said gradiometric measurements, arranging said gradiometers so as to generally describe said closed three-dimensional geometric shape which surrounds said entity.

5. The method according to claim 4, wherein said method further comprises, prior to said arranging of said gradiometers, prospectively optimizing said arranging of said gradiometers with respect to at least one parameter selected from the group consisting of:

the number of said gradiometers;

the positions of said gradiometers; and the orientations of said gradiometers.

6. The method according to claim 5, wherein said prospectively optimizing said arranging of said gradiometers includes relating, to said multipole moments, the directional derivatives corresponding to said gradiometric measurements.

7. The method according to claim 1, wherein said closed three-dimensional geometric shape is a prolate spheroid which surrounds said entity, and wherein said multipole moments are the prolate spheroidal multipole moments of said entity.

8. The method according to claim 7, wherein said method further comprises, based on said multipole moments, determining at least one magnetic field of said entity which is exterior of said prolate spheroid.

9. The method according to claim 7, wherein said determining said multipole moments includes relating, to said multipole moments, the directional derivatives corresponding to said gradiometric measurements.

10. The method according to claim 7, wherein said method further comprises, prior to said performing of said gradiometric measurements, arranging said gradiometers so as to generally describe said prolate spheroid which surrounds said entity.

11. The method according to claim 10, wherein said method further comprises, prior to said arranging of said gradiometers, prospectively optimizing said arranging of said gradiometers with respect to at least one parameter selected from the group consisting of:

the number of said gradiometers;

the positions of said gradiometers; and the orientations of said gradiometers.

12. The method according to claim 11, wherein said prospectively optimizing said arranging of said gradiometers includes relating, to said prolate spheroidal multipole moments, the directional derivatives corresponding to said gradiometric measurements.

13. A computer program product comprising a computer useable medium having computer program logic recorded thereon for enabling a computer to determine at least one magnetic field signature of an entity, said computer program logic comprising means for enabling said computer to determine the prolate spheroidal multipole moments of said entity, wherein said prolate spheroidal multipole moments are based on gradiometric measurements performed using plural gradiometers which are arranged so as to generally describe a prolate spheroidal shape which surrounds said entity.

14. A computer program product as recited in claim 13, said computer program logic further comprising means for enabling said computer to determine, based on said prolate spheroidal multipole moments, at least one magnetic field of said entity exterior of said prolate spheroidal shape.

15. A computer program product as recited in claim 14, wherein said means for enabling said computer to optimize said arranging of said gradiometers includes means for enabling said computer to establish relationships between said prolate spheroidal multipole moments and said at least one magnetic field.

16. A computer program product as recited in claim 13, wherein said means for enabling said computer to determine said prolate spheroidal multipole moments includes means for enabling said computer to:

determine the directional derivatives corresponding to said gradiometric measurements; and establish relationships between said directional derivatives and said prolate spheroidal multipole moments.

17. A computer program product as recited in claim 13, wherein said means for enabling said computer to determine said prolate spheroidal multipole moments includes means for enabling said computer to optimize said arranging of said gradiometers with respect to at least one parameter selected from the group consisting of:

the number of said gradiometers;

the positions of said gradiometers; and the orientations of said gradiometers.

18. A computer program product as recited in claim 17, wherein said means for enabling said computer to optimize said arranging of said gradiometers includes means for enabling said computer to establish relationships between said directional derivatives and said prolate spheroidal multipole moments.

19. Apparatus for determining at least one magnetic field signature of an entity, said apparatus comprising:

a plurality of gradiometers for performing gradiometric measurements, wherein said gradiometers are arranged so as to generally describe a prolate spheroidal shape which surrounds said entity; and a computer, electrically connected to said gradiometers, for:

establishing relationships between said gradiometric measurements and directional derivatives;

establishing relationships between said directional derivatives and said prolate spheroidal multipole moments; and establishing relationships between said prolate spheroidal multipole moments and at least one magnetic field of said entity which exists exterior of said prolate spheroidal shape.

20. Apparatus as defined in claim 19, wherein said computer is further for optimizing said arranging of said gradiometers with respect to at least one parameter selected from the group consisting of:

the number of said gradiometers;

the positions of said gradiometers; and the orientations of said gradiometers.

* * * * *